US012751071B2

(12) United States Patent
Liu et al.

(10) Patent No.: US 12,751,071 B2
(45) Date of Patent: Sep. 29, 2026

(54) SPLIT GATE TRENCH DEVICE

(71) Applicant: Excelliance MOS Corporation, Hsinchu County (TW)

(72) Inventors: Chu-Kuang Liu, Hsinchu County (TW); Hung-Kun Yang, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 505 days.

(21) Appl. No.: 18/150,204

(22) Filed: Jan. 5, 2023

(65) Prior Publication Data

US 2024/0128344 A1 Apr. 18, 2024

(30) Foreign Application Priority Data

Oct. 12, 2022 (TW) ................................ 111138548

(51) Int. Cl.

| | |
|---|---|
| *H10D 64/27* | (2025.01) |
| *H10D 30/01* | (2025.01) |
| *H10D 30/65* | (2025.01) |
| *H10D 30/66* | (2025.01) |
| *H10D 64/00* | (2025.01) |

(52) U.S. Cl.

CPC ....... *H10D 64/518* (2025.01); *H10D 30/0297* (2025.01); *H10D 30/658* (2025.01); *H10D 30/668* (2025.01); *H10D 64/117* (2025.01); *H10D 64/513* (2025.01); *H10D 64/516* (2025.01)

(58) Field of Classification Search

CPC .. H10D 64/117; H10D 64/513; H10D 64/512; H10D 64/518; H10D 30/0297; H10D 30/668; H10D 62/124

See application file for complete search history.

(56) References Cited

U.S. PATENT DOCUMENTS

| | | | | | |
|---|---|---|---|---|---|
| 8,816,431 | B2 * | 8/2014 | Bowers | H10D 30/0295 | 257/341 |
| 9,653,560 | B1 * | 5/2017 | Liu | H10D 64/513 | |
| 10,720,524 | B1 * | 7/2020 | Qiao | H10D 30/0297 | |
| 11,380,787 | B2 * | 7/2022 | Hsieh | H10D 62/111 | |
| 2011/0169103 | A1 * | 7/2011 | Darwish | H10D 62/158 | 257/E29.262 |
| 2013/0234241 | A1 * | 9/2013 | Bowers | H10D 64/513 | 257/330 |
| 2017/0338309 | A1 * | 11/2017 | Liu | H10D 64/117 | |

(Continued)

FOREIGN PATENT DOCUMENTS

| | | |
|---|---|---|
| TW | I577010 | 4/2017 |
| TW | M620290 | 11/2021 |

OTHER PUBLICATIONS

"Office Action of Taiwan Counterpart Application", issued on Jul. 31, 2023, p. 1-p. 5.

*Primary Examiner* — Vincent Wall

(74) *Attorney, Agent, or Firm* — JCIPRNET

(57) ABSTRACT

A split gate trench device, including a substrate, an epitaxial layer having a trench, and a split gate structure, is provided. The epitaxial layer is formed on the substrate, and the split gate structure is disposed in the trench. The split gate structure includes a shielding gate, two top gates, a shielding oxide layer, a gate oxide layer, and an inter-gate oxide layer. Each of the two top gates has a shape that is wide at the top and narrow at the bottom.

8 Claims, 11 Drawing Sheets

(56) References Cited

U.S. PATENT DOCUMENTS

| | | | | |
|---|---|---|---|---|
| 2018/0315846 | A1* | 11/2018 | Bobde | H10D 30/6891 |
| 2020/0273987 | A1* | 8/2020 | Zeng | H10D 30/0295 |
| 2020/0328302 | A1* | 10/2020 | Lin | H10D 30/0297 |
| 2021/0028305 | A1* | 1/2021 | Hsieh | H10D 84/146 |
| 2021/0320202 | A1* | 10/2021 | Hsieh | H10D 12/481 |
| 2021/0384346 | A1* | 12/2021 | Hsieh | H10D 64/117 |
| 2022/0149161 | A1* | 5/2022 | Hsieh | H10D 62/111 |
| 2023/0335621 | A1* | 10/2023 | Wang | H10D 64/117 |
| 2024/0128344 | A1* | 4/2024 | Liu | H10D 64/513 |

* cited by examiner

SPLIT GATE TRENCH DEVICE

CROSS-REFERENCE TO RELATED APPLICATION

This application claims the priority benefit of Taiwan application serial no. 111138548, filed on Oct. 12, 2022. The entirety of the above-mentioned patent application is hereby incorporated by reference herein and made a part of this specification.

BACKGROUND

Technical Field

The disclosure relates to a trench power device, and in particular to a split gate trench device.

Description of Related Art

Among power semiconductor devices, the power semiconductor device vertically disposed in the trench has become one of the focuses of development in all fields for being able to greatly increase the unit density.

In the structure of the split gate trench power device, the gate structure in the power semiconductor device disposed in the trench is separated by an inter-poly oxide (IPO) layer and divided into two potentials. The upper gate is used to form the channel of the power device, and the lower gate is electrically coupled to the source potential with metal interconnection and is used to generate two-dimensional charge balance under the cut-off operation. In addition, in order to reduce the gate-source capacitance (Cgs), the upper gate may be changed into two separate structures, thereby improving the switching performance. However, such a structure reduces the gate (cross-sectional area), resulting in an increase in the gate resistance (Rg).

SUMMARY

The disclosure provides a split gate trench device, which can reduce the gate-source capacitance (Cgs) while improving the switching performance of the device.

The split gate trench device of the disclosure includes a substrate, an epitaxial layer having a trench, and a split gate structure. The epitaxial layer is formed on the substrate, and the split gate structure is disposed in the trench. The split gate structure includes a shielding gate, a first top gate and a second top gate, a shielding oxide layer, a gate oxide layer, and an inter-gate oxide layer. The shielding gate is located inside the trench. The first top gate and the second top gate are respectively disposed above the shielding gate. Each of the first top gate and the second top gate has a shape that is wide at top and narrow at bottom. The gate oxide layer is located between the first top gate and the trench and between the second top gate and the trench. The shielding oxide layer is located between the shielding gate and the trench. The inter-gate oxide layer is located between the shielding gate, the first top gate, and the second top gate.

In an embodiment of the disclosure, a surface of the first top gate close to a sidewall of the trench is a first flat surface, a surface of the first top gate away from a sidewall of the trench is a first inclined surface, a surface of the second top gate close to a sidewall of the trench is a second flat surface, and a surface of the second top gate away from a sidewall of the trench is a second inclined surface.

In an embodiment of the disclosure, a surface of the first top gate close to a sidewall of the trench is a first flat surface, a surface of the first top gate away from a sidewall of the trench is composed of a first curved surface and a third flat surface, and the first curved surface is located above the third flat surface. A surface of the second top gate close to a sidewall of the trench is a second flat surface, a surface of the second top gate away from a sidewall of the trench is composed of a second curved surface and a fourth flat surface, and the second curved surface is located above the fourth flat surface.

In an embodiment of the disclosure, a projection of the shielding gate on the substrate partially overlaps with a projection of the first top gate on the substrate, and the projection of the shielding gate on the substrate partially overlaps with a projection of the second top gate on the substrate.

In an embodiment of the disclosure, a bottom surface of the first top gate and a bottom surface of the second top gate are both flat surfaces.

In an embodiment of the disclosure, the split gate trench device further includes a body region formed in the epitaxial layer and a source region formed in the body region and close to a top surface of the epitaxial layer.

In an embodiment of the disclosure, the gate oxide layer also extends over the source region.

In an embodiment of the disclosure, the body region and the source region have different conductivity.

In an embodiment of the disclosure, the split gate trench device further includes a drain electrode disposed on a bottom portion of the substrate.

In an embodiment of the disclosure, the gate oxide layer also extends to a top surface of the epitaxial layer.

Based on the above, according to the split gate trench device of the disclosure, the first top gate and the second top gate are respectively disposed above the shielding gate, and each of the first top gate and the second top gate has the shape that is wide at the top and narrow at the bottom, so the overall cross-sectional area of the gate can be increased. At the same time, since the gate is divided into two, the gate-source capacitance can be reduced, thereby reducing the switching loss.

In order for the features and advantages of the disclosure to be more comprehensible, the following specific embodiments are described in detail in conjunction with the drawings.

DETAILED DESCRIPTION OF DISCLOSED EMBODIMENTS

Figure 1:
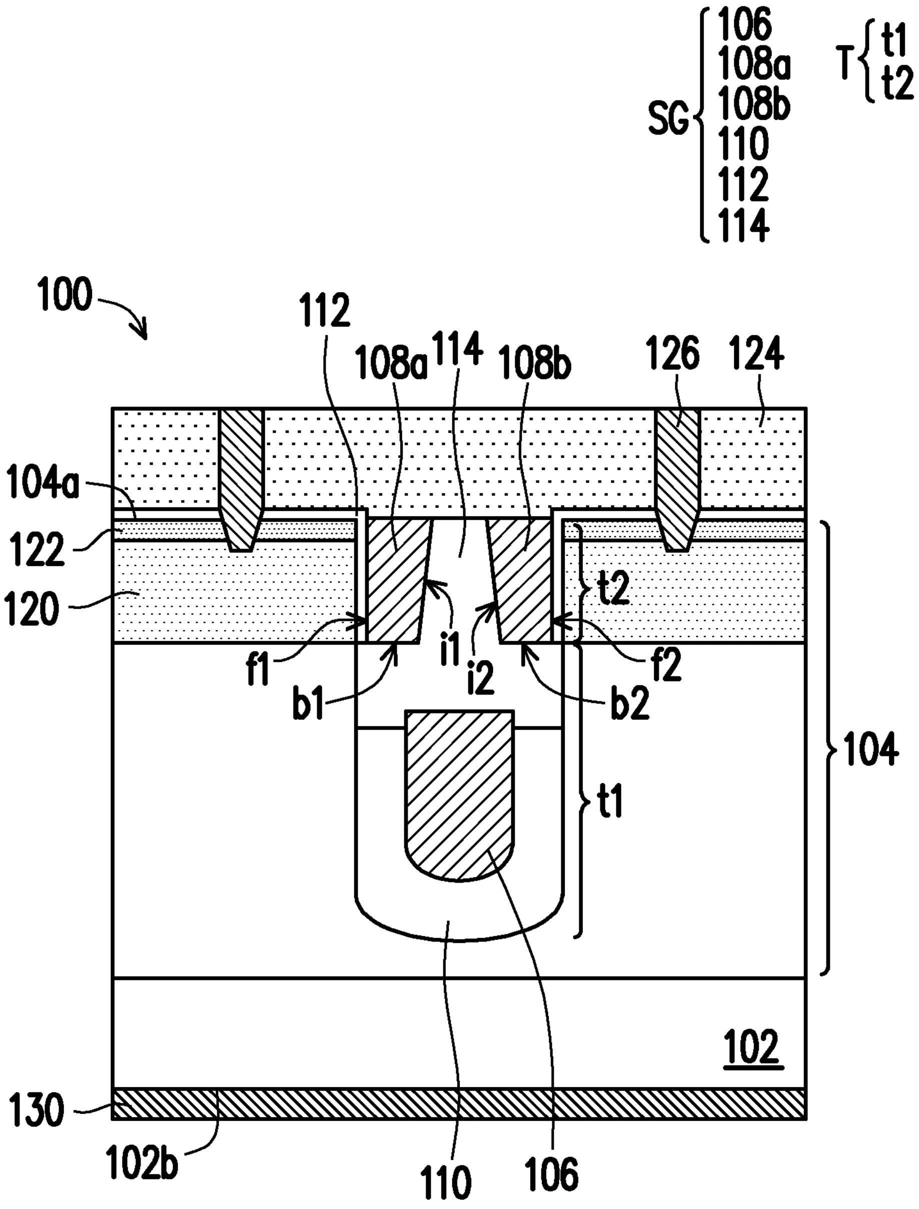
FIG. 1 is a schematic sectional view of a split gate trench device according to a first embodiment of the disclosure.

The following disclosure provides many different implementations or examples for implementing different features of the disclosure. Of course, the embodiments are only examples and are not intended to limit the scope and application of the disclosure. Furthermore, the relative thicknesses and positions of various components, film layers, or regions may be reduced or exaggerated for clarity. In addition, similar or identical reference numerals are used in the drawings to denote similar or identical devices or features, and if there are reference numerals in the drawing that are identical to the previous drawing, the detailed description thereof will be omitted.

FIG. 1 is a schematic sectional view of a split gate trench device according to a first embodiment of the disclosure.

Please refer to FIG. 1. A split gate trench device 100 of the first embodiment basically includes a substrate 102, an epitaxial layer 104 having a trench T, and a split gate structure SG. The trench T is divided into a first part t1 and a second part t2, and the first part t1 is located below the second part t2. The substrate 102 is a semiconductor substrate, such as a silicon substrate, and the epitaxial layer 104 is formed on the substrate 102. In an embodiment, the substrate 102 is an N+ substrate, and the epitaxial layer 104 is an N− epitaxial layer.

The split gate structure SG is disposed in the trench T, and the split gate structure SG basically includes a shielding gate 106, a first top gate 108*a*, a second top gate 108*b*, a shielding oxide layer 110, a gate oxide layer 112, and an inter-gate oxide layer 114. The shielding gate 106 is located inside (the first part t1 of) the trench T, and the first top gate 108*a* and the second top gate 108*b* are respectively disposed above the shielding gate 106 and located in the second part t2. The shielding oxide layer 110 is located between the shielding gate 106 and the trench T, and the gate oxide layer 112 is located between the first top gate 108*a* and the trench T and between the second top gate 108*b* and the trench T. The materials of the shielding gate 106, the first top gate 108*a*, and the second top gate 108*b* may be polysilicon or other suitable conductive materials.

Please continue to refer to FIG. 1. The inter-gate oxide layer 114 is located between the shielding gate 106, the first top gate 108*a*, and the second top gate 108*b*. In detail, the inter-gate oxide layer 114 is an oxide structure obtained by an etching process and that is simultaneously between the shielding gate 106 and the first top gate 108*a*, between the shielding gate 106 and the second top gate 108*b*, and between the first top gate 108*a* and the second top gate 108*b*. Each of the first top gate 108*a* and the second top gate 108*b* has a shape that is wide at the top and narrow at the bottom, the wider part is away from the shielding gate 106, and the narrower part is close to the shielding gate 106. Since the shielding gate 106, the first top gate 108*a*, and the second top gate 108*b* are usually polysilicon, the inter-gate oxide layer 114 is also referred to as an inter-poly oxide (IPO). The cross-sectional areas of the first top gate 108*a* and the second top gate 108*b* are greater than conventional polysilicon gates formed on two sides of the trench T by etching back, so a gate resistance Rg can be reduced.

In an embodiment, a surface of the first top gate 108*a* close to a sidewall of the trench T is a first flat surface f1, and a surface of the first top gate 108*a* away from the sidewall of the trench T is a first inclined surface i1. A surface of the second top gate 108*b* close to the sidewall of the trench T is a second flat surface f2, and a surface of the second top gate 108*b* away from the sidewall of the trench T is a second inclined surface i2. Although the side wall of the first part t1 of the trench Tin FIG. 1 is shown as a flat surface, the disclosure is not limited thereto. In another embodiment, the entire sidewall of the trench T may be slightly inclined due to the manufacturing process, and the first flat surface f1 and the second flat surface f2 may also be slightly inclined flat surfaces, but such a change still enables the first top gate 108*a* to have the shape that is wide at the top and narrow at the bottom, and the second top gate 108*b* to have the shape that is wide at the top and narrow at the bottom. A bottom surface b1 of the first top gate 108*a* and a bottom surface b2 of the second top gate 108*b* are both flat surfaces, but the disclosure is not limited thereto.

Please refer to FIG. 1 again. The first top gate 108*a* and the second top gate 108*b* are respectively disposed on the two sides in the trench T. Since FIG. 1 is a sectional view in a single direction, if the trench T in fact extends along another direction, the first top gate 108*a* and the second top gate 108*b* will also extend into long strips in the direction, and the shielding gate 106 will also extend into a long strip in the direction. In addition, if viewed from the floor plan, the first top gate 108*a* will partially overlap with the shielding gate 106, that is, a projection of the shielding gate 106 on the substrate 102 partially overlaps with a projection of the first top gate 108*a* on the substrate 102. Likewise, the projection of the shielding gate 106 on the substrate 102 partially overlaps with a projection of the second top gate 108*b* on the substrate 102. Such a configuration can prevent the gate resistance Rg from becoming too large.

In FIG. 1, the split gate trench device 100 may further include a body region 120 and a source region 122. In the first embodiment, the body region 120 is formed in the epitaxial layer 104, and a depth thereof is similar to a range of the first part t1 of the trench T; and the source region 122 is formed in the body region 120 and is close to a top surface 104*a* of the epitaxial layer 104, wherein the body region 120 and the source region 122 have different conductivity, for example, the body region 120 is a P− region, and the source region 122 is an N+ region. In addition, the source region 122 may be connected to interconnection (not shown) through a contact 126 formed in the dielectric layer 124. The contact 126 may pass through the gate oxide layer 112, the source region 122, and a part of the body region 120 under the dielectric layer 124, and another P+ region (not shown) may be formed in a region on a bottom portion of the contact 126. A drain electrode 130 may be disposed on a bottom portion 102*b* of the substrate 102 to form a trench power device.

Figure 2:
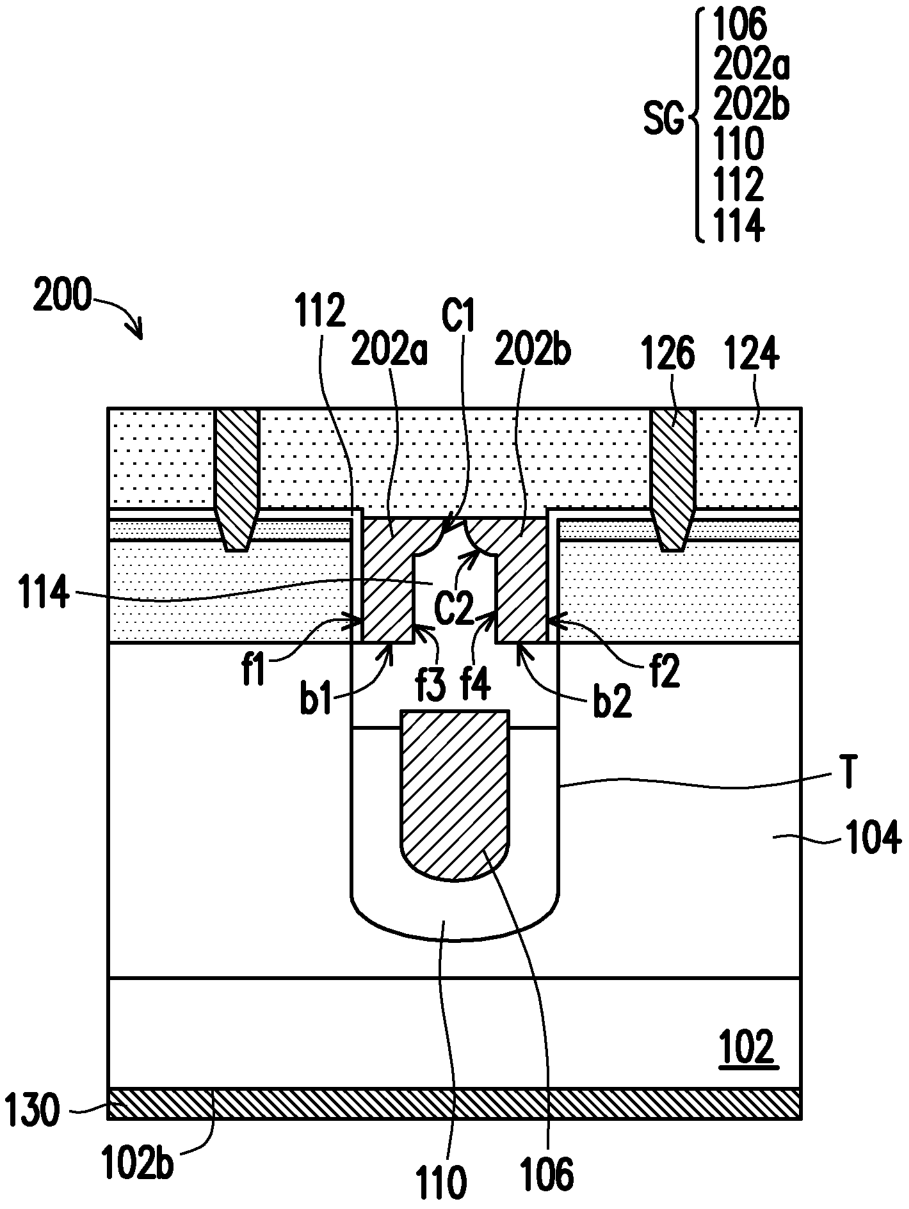
FIG. 2 is a schematic sectional view of a split gate trench device according to a second embodiment of the disclosure.

FIG. 2 is a schematic sectional view of a split gate trench device according to a second embodiment of the disclosure, wherein the same or similar portions and components are represented by the same reference numerals as the first embodiment, and for the relevant content of the same or similar portions and components, reference may also be made to the content of the first embodiment, which will not be repeated.

Please refer to FIG. 2. The difference between a split gate trench device 200 of the second embodiment and the first embodiment lies in structures of a first top gate 202*a* and a second top gate 202*b* in the split gate structure SG. The first top gate 202*a* and the second top gate 202*b* also have the same shape that is wide at the top and narrow at the bottom, but a surface of the first top gate 202*a* away from the sidewall of the trench T is composed of a first curved surface c1 and a third flat surface f3, and a surface of the second top gate 202*b* away from the side wall of the trench T is composed of a second curved surface c2 and a fourth flat surface f4. The first curved surface c1 is located above the third flat surface f3, and the second curved surface c2 is located above the fourth flat surface f4. In an embodiment, an included angle between a tangent of a bottom portion of the first curved surface c1 and the third flat surface f3 is greater than 90 degrees, and an included angle between a tangent of a bottom portion of the second curved surface c2 and the fourth flat surface f4 is greater than 90 degrees.

Since cross-sectional areas of the first top gate 202*a* and the second top gate 202*b* of the second embodiment are also greater than the conventional polysilicon gates formed on the two sides of the trench T by etching back, the gate resistance Rg can be reduced. Moreover, the projection of the shielding gate 106 on the substrate 102 partially overlaps with a projection of the first top gate 202*a*/second top gate 202*b* on the substrate 102, so the gate resistance Rg will not become too large.

FIG. 3A to FIG. 3K are schematic sectional views of a manufacturing process of a split gate trench device according to a third embodiment of the disclosure.

Figure 3A:
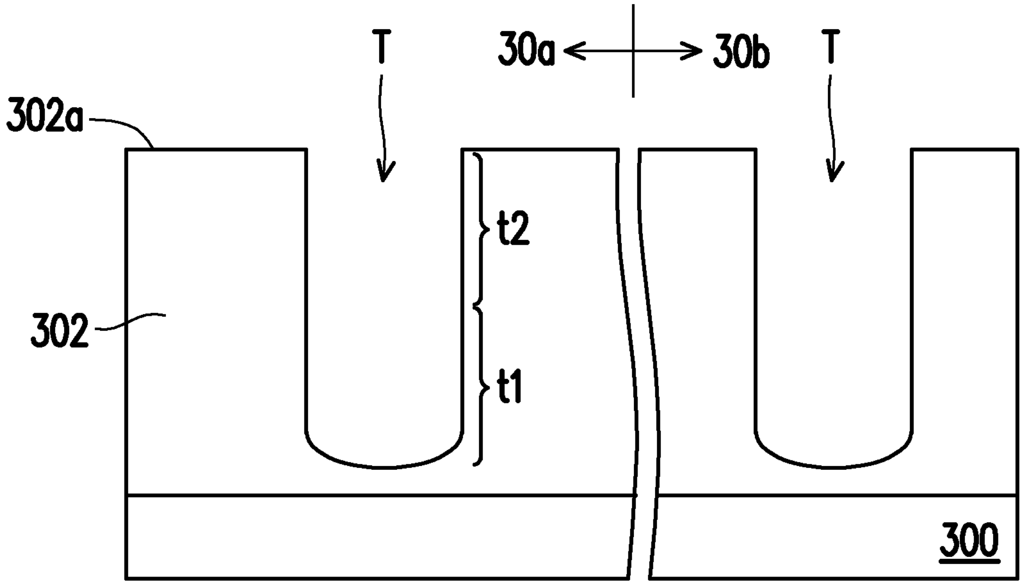
FIG. 3A to FIG. 3K are schematic sectional views of a manufacturing process of a split gate trench device according to a third embodiment of the disclosure.

In FIG. 3A, a substrate 300 is divided into a device region 30*a* and a peripheral region 30*b*. The third embodiment mainly focuses on the manufacturing of a split gate trench device in the device region 30*a*, and can simultaneously manufacture a trench gate structure in the peripheral region 30*b*. However, the disclosure is not limited thereto. In another embodiment, the trench gate structure in the peripheral region 30*b* may be manufactured by adopting different manners.

Please refer to FIG. 3A first. An epitaxial layer 302 is formed on the substrate 300, the trench T is then formed in the epitaxial layer 302, and the trench T is divided into the first part t1 and the second part t2, wherein the second part t2 is located above the first part t1. The method for forming the trench T is to, for example, first form an oxide layer and a hard mask (not shown) on a surface 302*a* of the epitaxial layer 302, then expose the surface 302*a* of the epitaxial layer 302 to form the trench T using a photolithography etching process, and then dry etch (anisotropic etch) the epitaxial layer 302 using the hard mask as an etching mask to form the trench T.

Figure 3B:
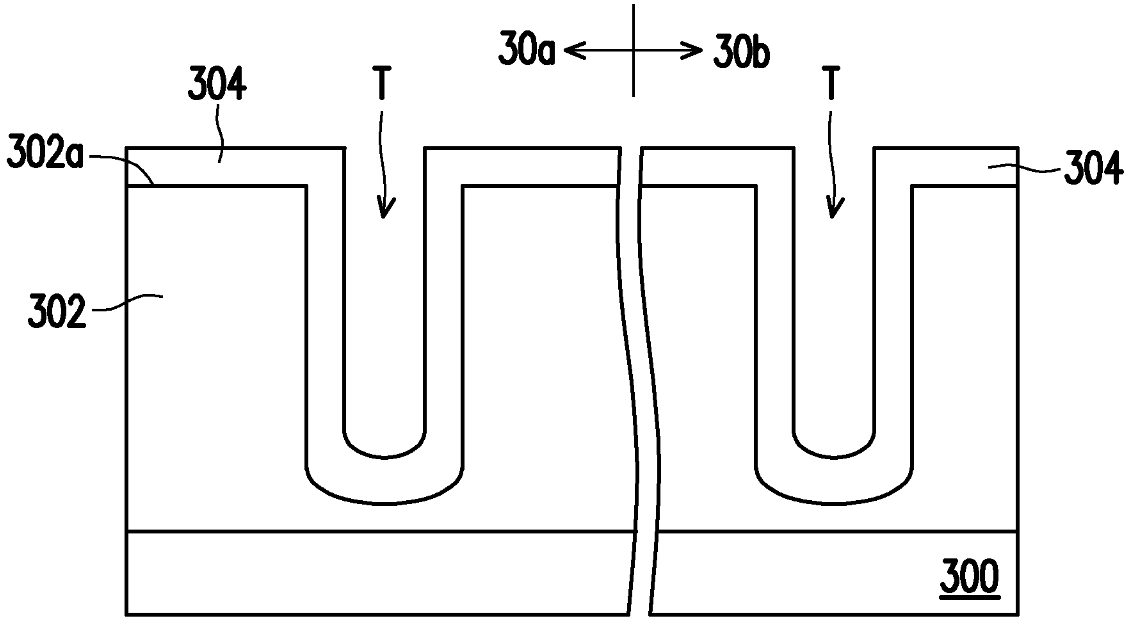

Then, please refer to FIG. 3B. In order to form a shielding gate and a shielding oxide layer, a shielding oxide layer 304 may be first conformally deposited on an entire inner surface of the trench T. At the same time, the shielding oxide layer 304 is also deposited on the surface 302*a* of the epitaxial layer 302.

Figure 3C:
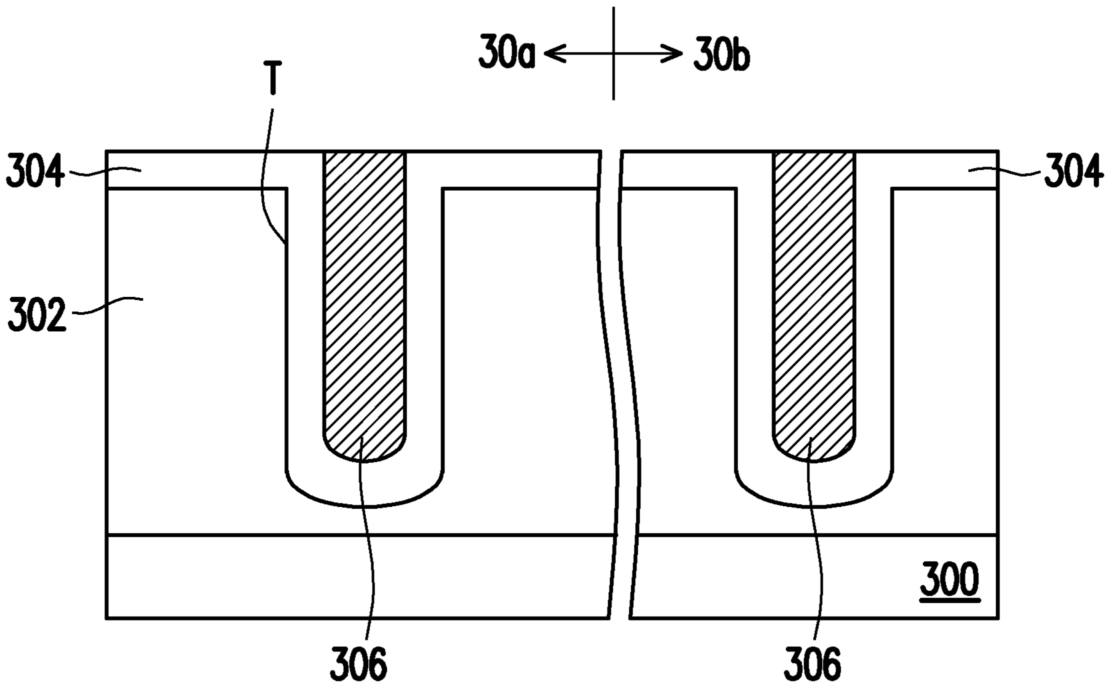

Then, please refer to FIG. 3C. The trench T is filled with a conductive material 306. The formation of the conductive material 306 is to, for example, first fully deposit polysilicon, and then fully etch back the polysilicon to remove polysilicon other than the trench T.

Figure 3D:
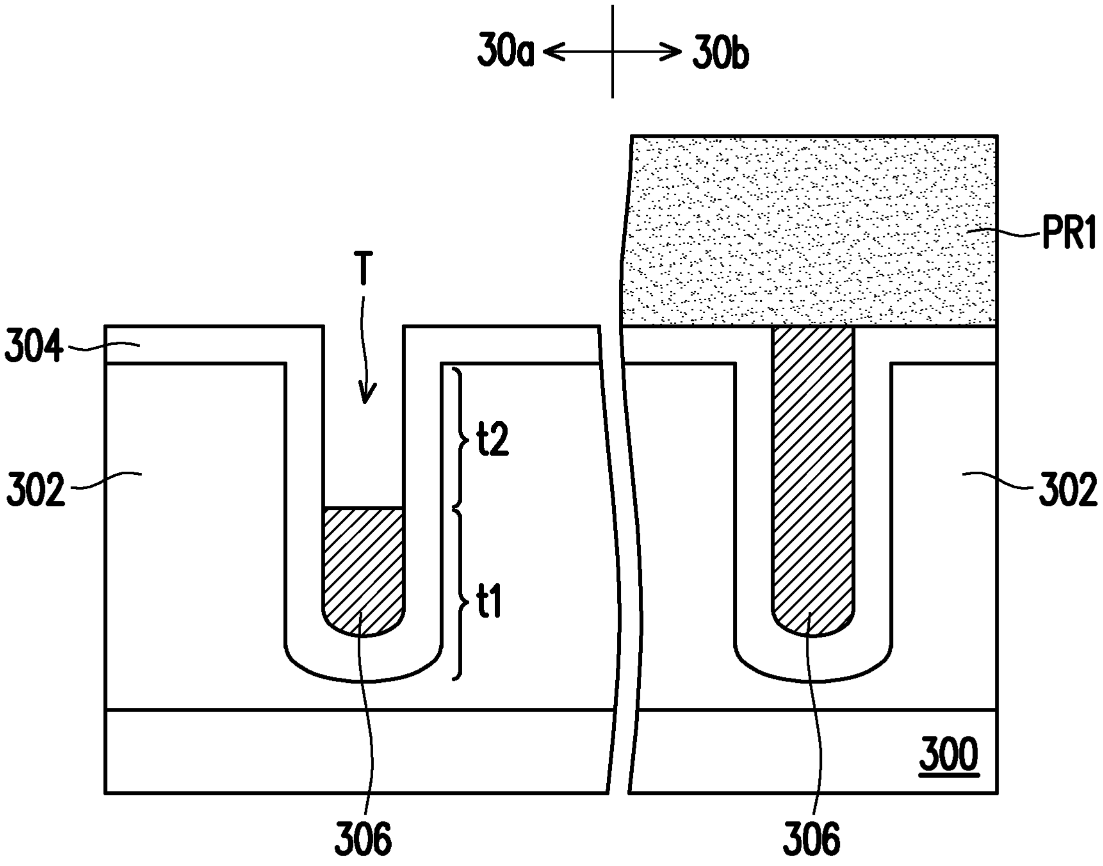

Next, please refer to FIG. 3D. The peripheral region 30*b* is covered with a photoresist layer PR1 to ensure that the conductive material 306 of the peripheral region 30*b* is not affected by subsequent processes. The conductive material 306 outside the first part t1 of the trench T is removed, and the shielding oxide layer 304 located in the second part t2 is exposed.

Figure 3E:
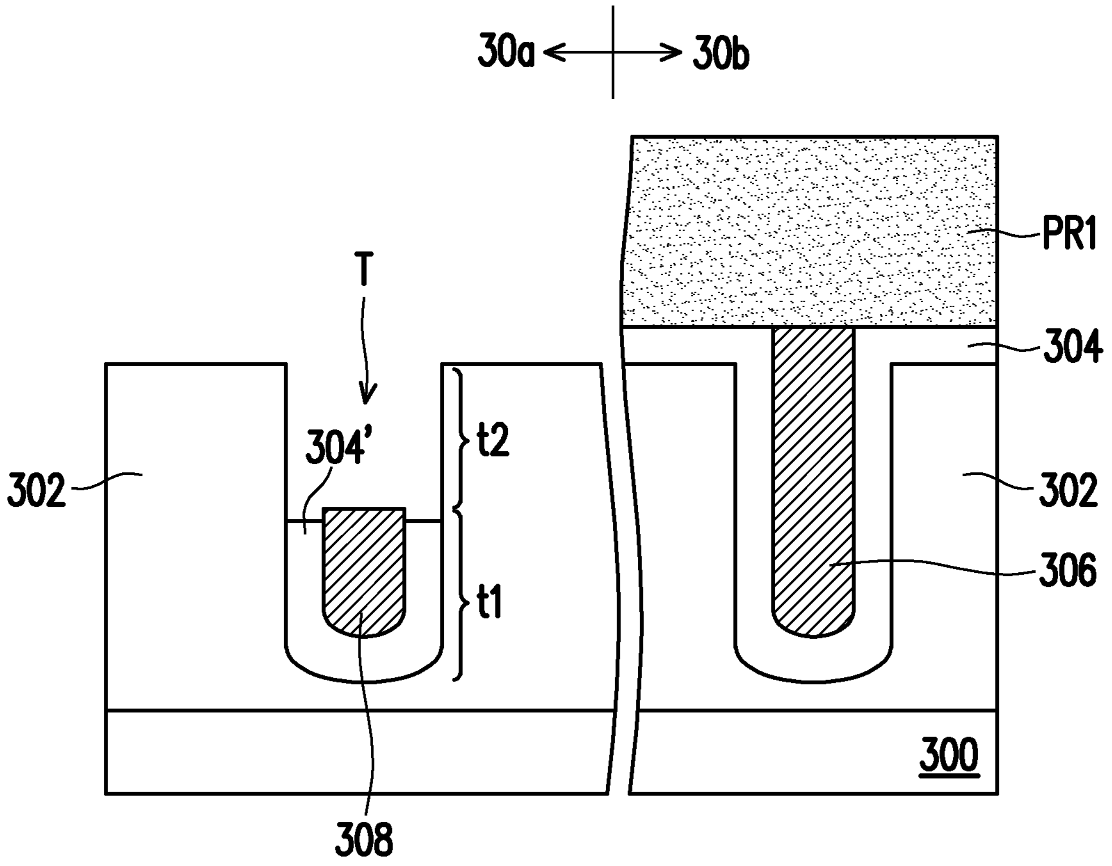

Then, please refer to FIG. 3E. The shielding oxide layer 304 exposed in FIG. 3D is removed to form a shielding gate 308 and a shielding oxide layer 304' in the first part t1 of the trench T, wherein the shielding oxide layer 304' is located between the shielding gate 308 and the trench T and exposes the second part t2.

Figure 3F:
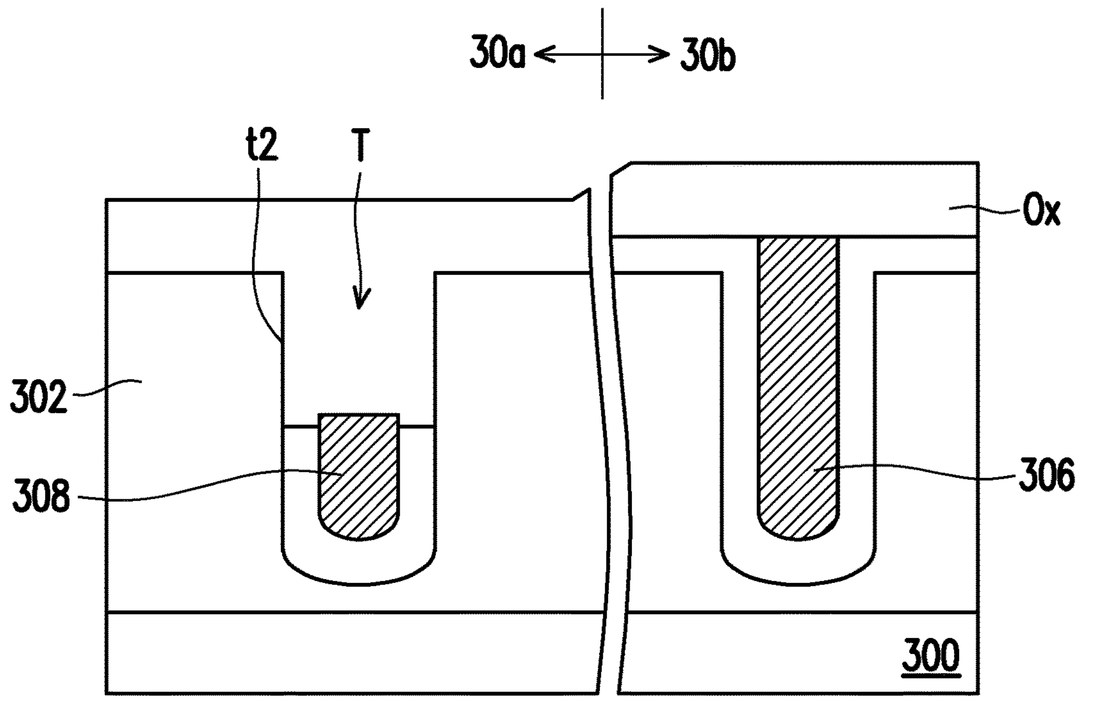

After that, please refer to FIG. 3F. After removing the photoresist layer PR1, the second part t2 of the trench T is filled with an oxide Ox, wherein the method for forming the oxide Ox is to, for example, perform full deposition using high-density plasma chemical vapor deposition (HDP-CVD).

Figure 3G:
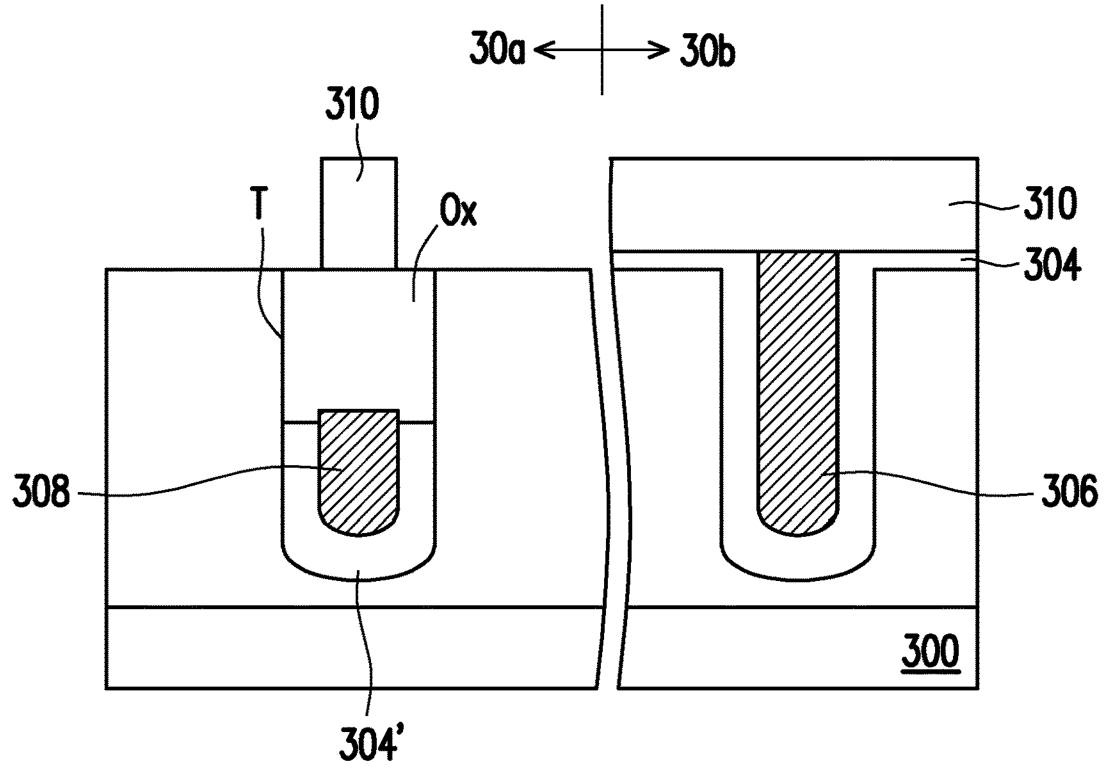

Then, please refer to FIG. 3G. If the oxide Ox fully covers the device region 30*a* and the peripheral region 30*b* as shown in FIG. 3F, a chemical mechanical planarization process may be first performed on the oxide Ox, and etch back is then performed to remove the oxide Ox outside the trench T. Next, a patterned mask layer 310 is formed on the oxide Ox, and parts where two grooves to be formed are exposed. In an embodiment, the patterned mask layer 310 is formed above the shielding gate 308 and a projection thereof overlaps with a projection of the shielding gate 308 on the substrate 300. In addition, the patterned mask layer 310 may also fully cover the peripheral region 30*b* to ensure that the structure of the peripheral region 30*b* is not affected by subsequent processes.

Figure 3H:
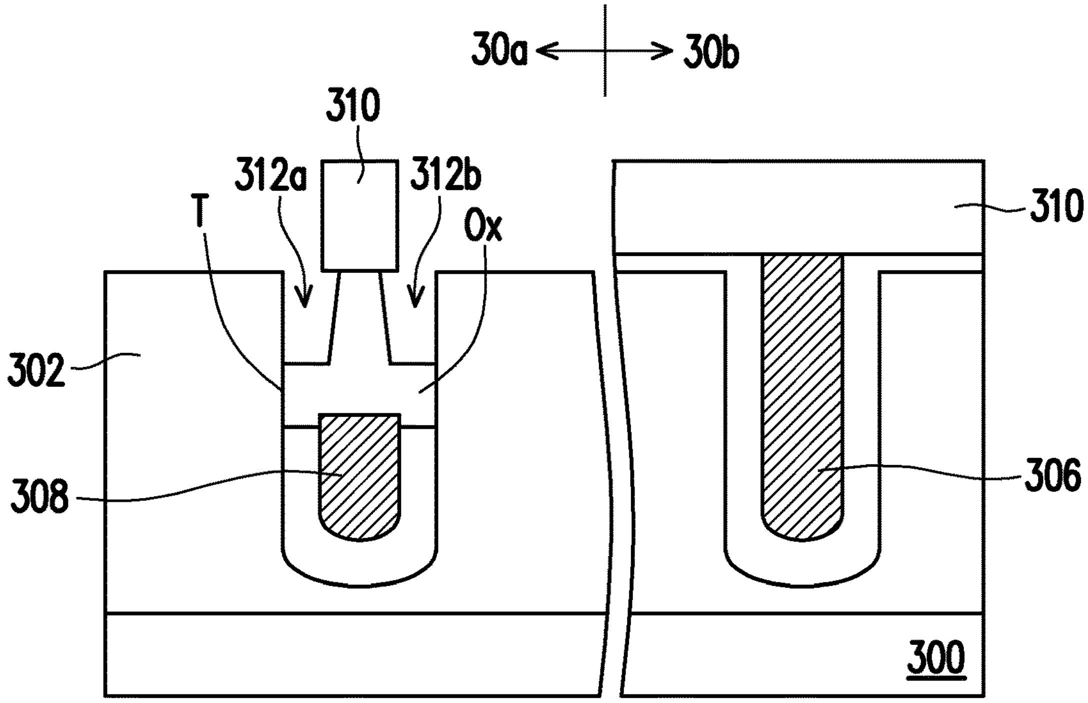

Then, please refer to FIG. 3H. Oxide dry etching is performed to form two grooves 312*a* and 312*b* having a contour that is wide at the top and narrow at the bottom in the oxide Ox, and expose a part of the sidewall of the trench T. The oxide dry etching forms a groove contour having an inclined surface using the patterned mask layer 310 as an etching mask, while applying anisotropic etching characteristics of dry etching to etch down.

Figure 3I:
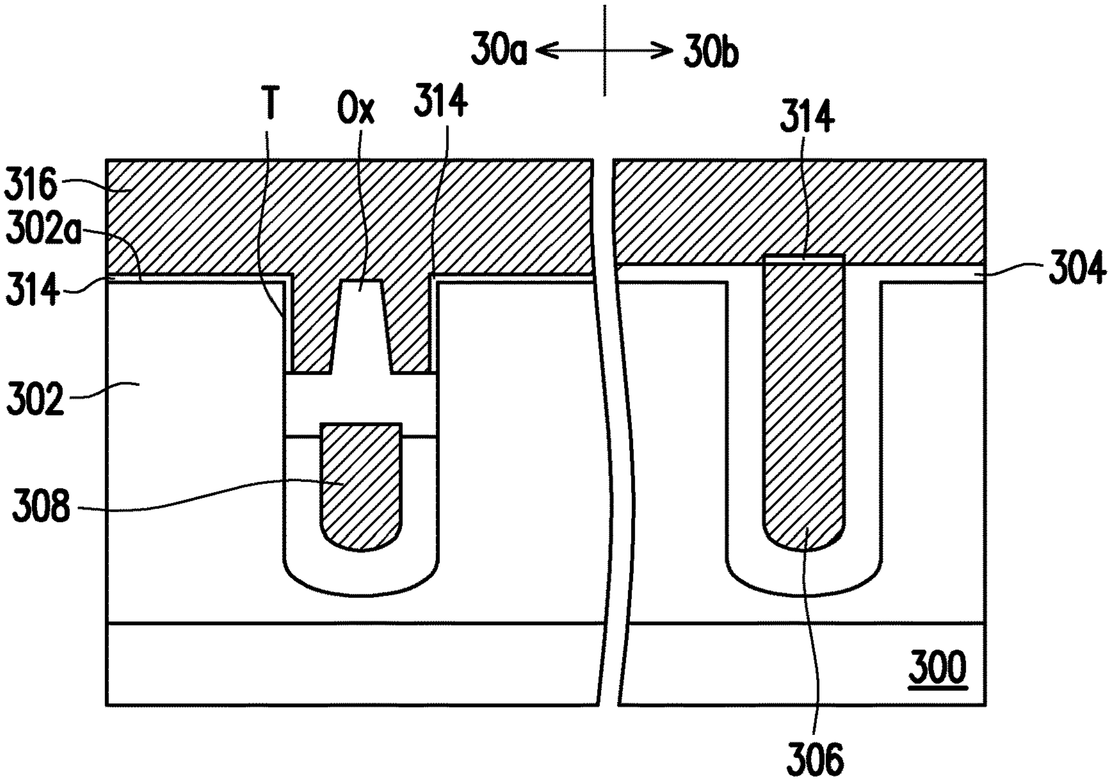

Next, please refer to FIG. 3I. All of the patterned mask layer 310 in FIG. 3H is first removed, a gate oxide layer 314 is then formed on a surface of the sidewall T exposed in FIG. 3H, and the gate oxide layer 314 may be simultaneously formed on the surface 302*a* of the epitaxial layer 302 and a surface of the conductive material 306 in the peripheral region 30*b*. Then, an entire layer of the conductive material 316, such as polysilicon, is deposited on the epitaxial layer 302.

Figure 3J:
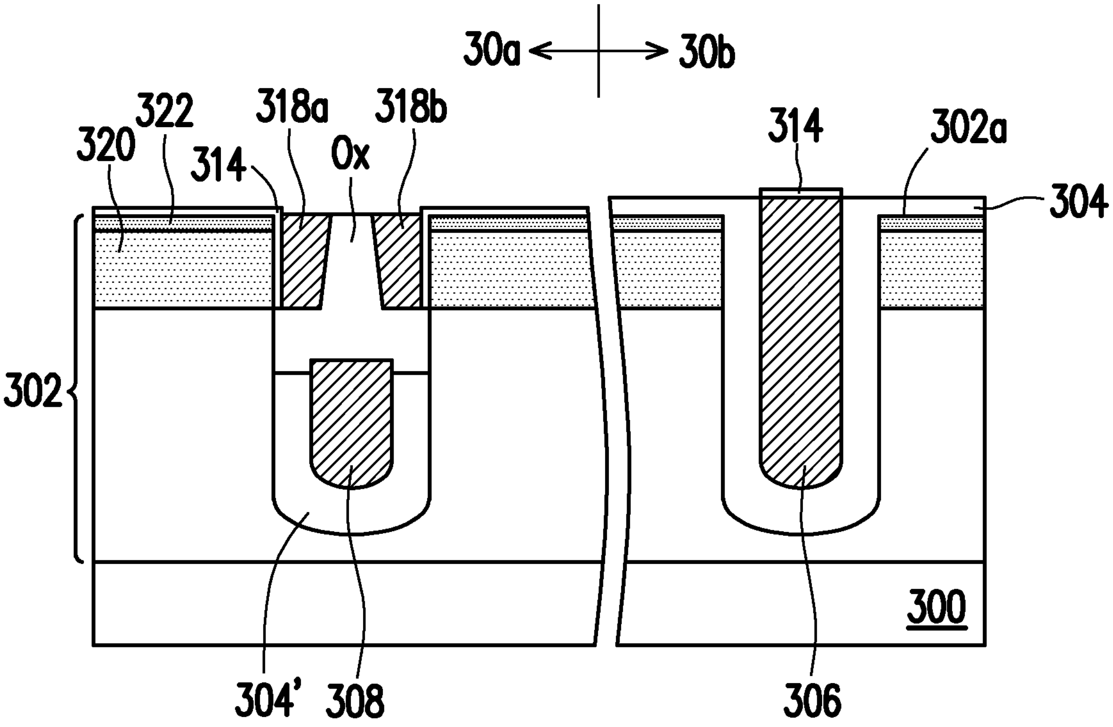

Then, please refer to FIG. 3J. After a planarization step, a first top gate 318*a* and a second top gate 318*b* may be formed in each of the two grooves 312*a* and 312*b* in FIG. 3H to complete a split gate structure including the shielding gate 308, the first top gate 318*a*, the second top gate 318*b*, the shielding oxide layer 304', the gate oxide layer 314, and the inter-gate oxide layer (the oxide Ox). After that, a body region 320 and a source region 322 may be formed in the epitaxial layer 302, and the forming method is to, for example, first implant p-type dopants from the surface 302*a* by ion implantation to form the P− body region 320, and then implant n-type dopants from the surface 302*a* by ion implantation to form the N+ source region 322. At the same time, the body region 320 and the source region 322 may also be formed in the peripheral region 30*b*.

Figure 3K:
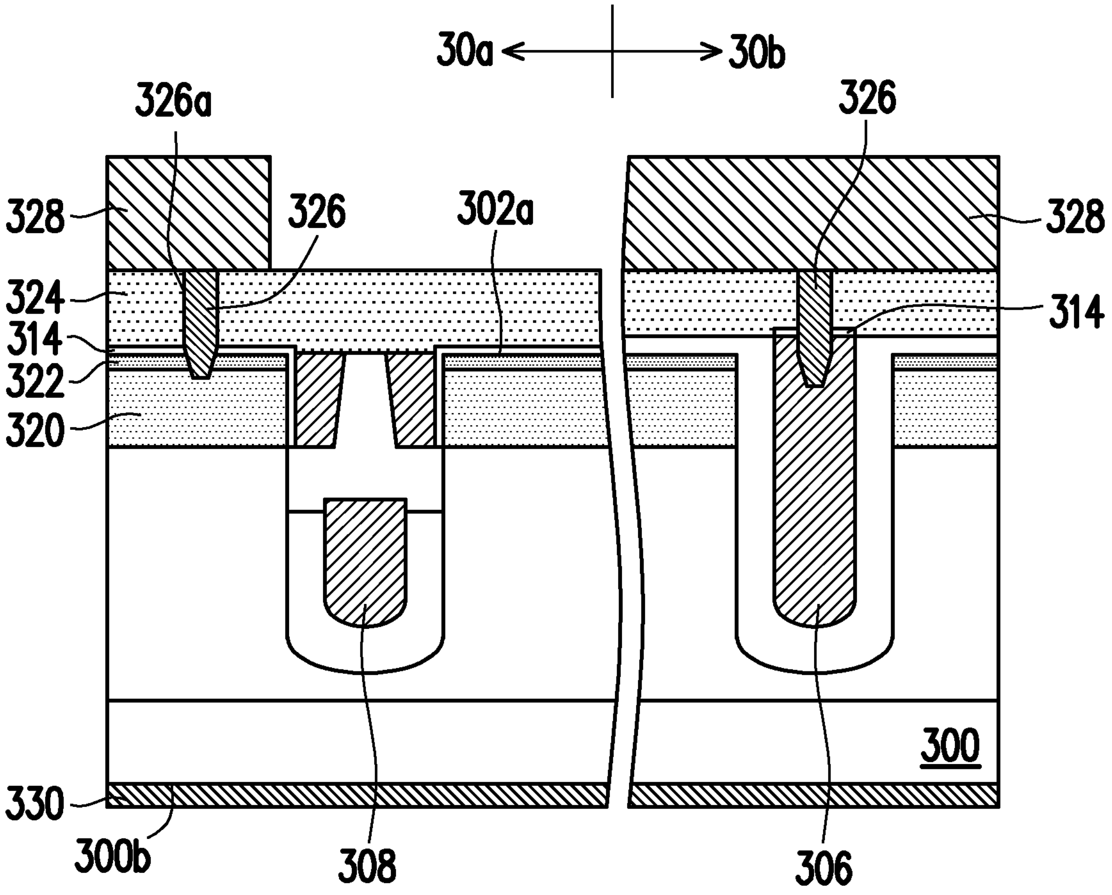

After that, please refer to FIG. 3K. An entire layer of a dielectric layer 324 may be first formed on the structure of FIG. 3J, and a contact 326 is then formed therein and passes through the gate oxide layer 314, the source region 322, and a part of the body region 320 under the dielectric layer 324, wherein the method for forming the contact 326 is to, for example, form a patterned photoresist layer (not shown) on the dielectric layer 324 after forming the dielectric layer 324 to expose a part where the contact 326 is to be formed, then etch to form an opening 326*a* passing through the dielectric layer 324, the gate oxide layer 314, the source region 322, and a part of the body region 320, and then fill the opening 326*a* with a conductive material to form the contact 326. In addition, after forming the opening 326*a* and before filling the conductive material, the p-type dopants may be implanted from the opening 326*a* by ion implantation to pre-form a P+ region (not shown) in a region on the bottom portion of the contact 326. After that, source metal layers 328 connecting the contacts 326 of the device region 30*a* and the peripheral region 30*b* are formed. The conductive material 306 in the peripheral region 30*b* may be electrically connected to the source region 322 of the device region 30*a* through the source metal layer 328, and in the embodiment, the shielding gate 308 and the conductive material 306 in the peripheral region 30*b* are of the same structure and are connected to each other.

In addition to the above process of the third embodiment, FIG. 3H may also use the following steps instead.

Figure 4A:
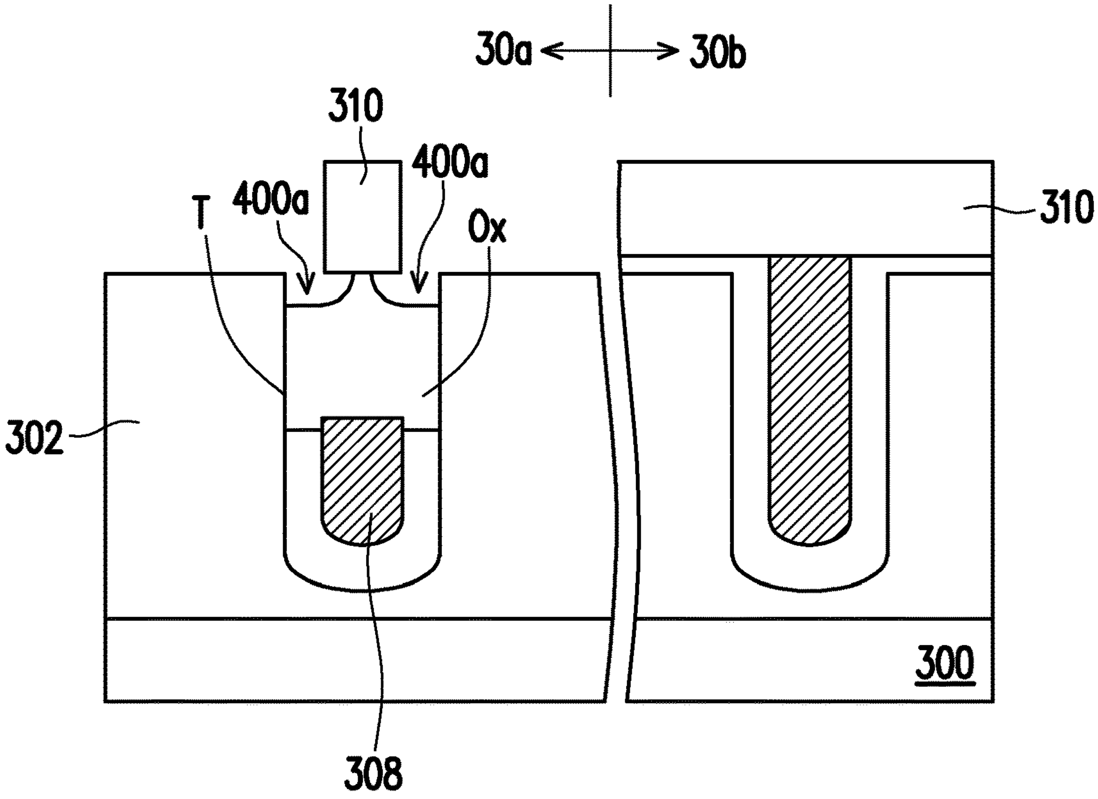
FIG. 4A and FIG. 4B are schematic sectional views of a manufacturing process of an alternative example of FIG. 3H according to the third embodiment.

First, please refer to FIG. 4A. After forming the patterned mask layer 310 on the oxide Ox and exposing parts where grooves are to be formed, oxide wet etching may be first performed to form an upper groove 400*a* having a curved surface, wherein the oxide wet etching here is to, for example, etch using a buffered hydrofluoric acid (HF) or a diluted HF as an etchant. Since wet etching is isotropic etching, a range of the upper groove 400*a* will expand to below the patterned mask layer 310, but there will be a predetermined distance between the two upper grooves 400*a*.

Figure 4B:
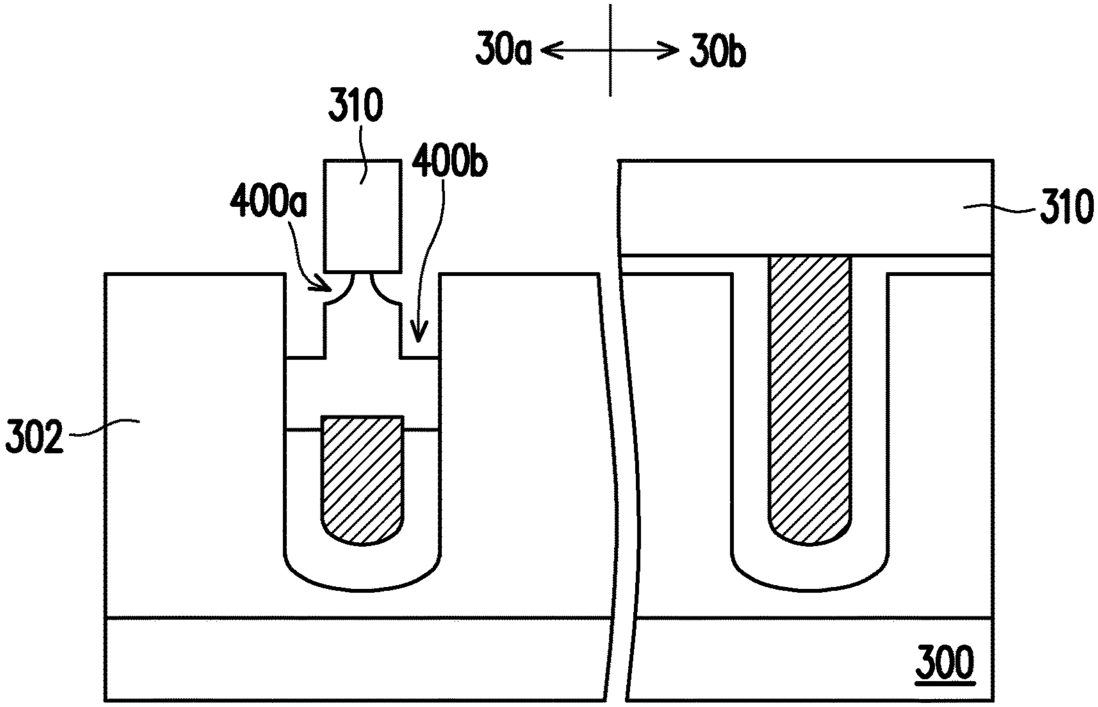

Next, please refer to FIG. 4B, oxide dry etching is performed to form a lower groove 400*b* having a flat surface, wherein the oxide dry etching also uses the patterned mask layer 310 as an etching mask, so a cross-sectional shape of the lower groove 400*b* does not change much. A groove composed of the lower groove 400*b* and the upper groove 400*a* that is wide at the top and narrow at the bottom is obtained, so following the steps of FIG. 3I to FIG. 3J, the first top gate 202*a* and the second top gate 202*b* as shown in FIG. 2 may be obtained.

In summary, the method of the disclosure is to first form the two grooves having the contour that is wide at the top and narrow at the bottom in the inter-gate oxide layer, and then deposit polysilicon therein to form the gate that is wide at the top and narrow at the bottom, so the overall cross-sectional area of the gate can be increased, thereby reducing the gate resistance. At the same time, since the top gate of the split gate trench device is divided into two, the gate-source capacitance can be reduced, thereby reducing the switching loss.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A split gate trench device, comprising:

a substrate;

an epitaxial layer, formed on the substrate and having a trench, wherein the trench has two vertical sidewalls; and a split gate structure, disposed in the trench and comprising:

a shielding gate, located inside the trench;

a first top gate and a second top gate, respectively disposed above the shielding gate, wherein each of the first top gate and the second top gate has a shape that is wide at top and narrow at bottom, a surface of the first top gate and a surface of the second top gate close to the two vertical sidewalls of the trench are flat surfaces, and a surface of the first top gate and a surface of the second top gate away from the two vertical sidewalls of the trench comprise symmetrical inclined surfaces, the surface of the first top gate away from one of the two vertical sidewalls of the trench is composed of a first curved surface and a third flat surface, wherein the first curved surface is located above the third flat surface, and the surface of the second top gate away from another one of the two vertical sidewalls of the trench is composed of a second curved surface and a fourth flat surface, wherein the second curved surface is located above the fourth flat surface;

a gate oxide layer, located between the first top gate and the trench and between the second top gate and the trench;

a shielding oxide layer, located between the shielding gate and the trench; and an inter-gate oxide layer, located between the shielding gate, the first top gate, and the second top gate, wherein the inter-gate oxide layer between the first top gate and the second top gate has a top and a bottom, and in a cross-sectional view, the top is narrower than the bottom, wherein an included angle between a tangent of a bottom portion of the first curved surface and the third flat surface is greater than 90 degrees, and an included angle between a tangent of a bottom portion of the second curved surface and the fourth flat surface is greater than 90 degrees.

2. The split gate trench device according to claim 1, wherein a projection of the shielding gate on the substrate partially overlaps with a projection of the first top gate on the substrate, and the projection of the shielding gate on the substrate partially overlaps with a projection of the second top gate on the substrate.

3. The split gate trench device according to claim 1, wherein a bottom surface of the first top gate and a bottom surface of the second top gate are both flat surfaces.

4. The split gate trench device according to claim 1, further comprising:

a body region, formed in the epitaxial layer; and a source region, formed in the body region and close to a top surface of the epitaxial layer.

5. The split gate trench device according to claim 4, wherein the gate oxide layer also extends over the source region.

6. The split gate trench device according to claim 4, wherein the body region and the source region have different conductivity.

7. The split gate trench device according to claim 1, further comprising a drain electrode, disposed on a bottom portion of the substrate.

8. The split gate trench device according to claim 1, wherein the gate oxide layer also extends to a top surface of the epitaxial layer.

* * * * *